United States Patent [19]

Boudewijns

[11] Patent Number: 4,929,998

[45] Date of Patent: May 29, 1990

[54] INTEGRATED CIRCUIT HAVING PLURAL CAPACITANCES OF DIFFERENT VALUES

[75] Inventor: Arnoldus J. J. Boudewijns, Eindhoven, Netherlands

[73] Assignee: U.S. Philips Corp., New York, N.Y.

[21] Appl. No.: 263,992

[22] Filed: Oct. 25, 1988

Related U.S. Application Data

[63] Continuation of Ser. No. 810,440, Dec. 17, 1985, abandoned.

[30] Foreign Application Priority Data

Dec. 24, 1984 [NL] Netherlands ................... 8403932

[51] Int. Cl.$^5$ .................. H01L 27/10; H01L 27/15
[52] U.S. Cl. .................................. 357/45; 357/51; 357/41; 361/328
[58] Field of Search ................. 357/45, 51, 41; 361/322, 328, 330; 365/102

[56] References Cited

FOREIGN PATENT DOCUMENTS 58-103163  6/1983  Japan .

OTHER PUBLICATIONS

Lee, H., et al, "A Self-Calibrating 12b 12us CMOS ADC", 1984 IEEE Int'l. Solid State Circuits Conference, Feb. 1984, pp. 64–65, 319.

McCreary, J., et al., IEEE Journal of Solid State Circuits, vol. SC-10, No. 6, Dec. 1975, pp. 371–379.

Ohri, K., et al., IEEE Trans. on Communications, vol. Com.-27, No. 2, Feb. 1979, pp. 296–304.

*Primary Examiner*—Andrew J. James
*Assistant Examiner*—Sara W. Crane
*Attorney, Agent, or Firm*—Steven R. Biren

[57] ABSTRACT

An integrated circuit includes capacitances of different capacitance values, this circuit having rows of basic capacitances, while the capacitances have different numbers of basic capacitances connected in parallel between a first connection electrode and an associated second connection electrode. Plural rows have the same number of n basic capacitances and in different ones of these rows different numbers of basic capacitances form part of the capacitances, all the remaining basic capacitances of the relevant rows being dummy capacitances. The second capacitance electrodes are connected to one or more further connection electrodes.

9 Claims, 6 Drawing Sheets

INTEGRATED CIRCUIT HAVING PLURAL CAPACITANCES OF DIFFERENT VALUES

BACKGROUND OF THE INVENTION

This application is a continuation of Ser. No. 810,442, filed on 12/17/85, now abandoned.

The invention relates to an integrated circuit comprising plural capacitances which have different capacitance values, this circuit comprising a semiconductor body, at a surface of which rows of first capacitance electrodes are arranged beside each other, each of these first capacitance electrodes being separated by a di-electric layer from a second capacitance electrode, the first and second capacitance electrodes constituting the electrodes of basic capacitances arranged in rows, while different numbers of basic capacitances between one or more first and one or more associated second connection electrodes are connected in parallel with each other for forming the capacitances having different capacitance values by interconnection of first and second capacitance electrodes, plural rows of basic capacitances having the same number n of first capacitance electrodes, and each of these rows of n basic capacitances having a first row conductor by means of which all n first capacitance electrodes of the relevant row are interconnected, this relevant row of interconnected first capacitance electrodes forming a first connection electrode, and a first group of interconnected second capacitance electrodes of these rows of n basic capacitances forming a second connection electrode associated with this first electrode, while a second group of interconnected second capacitance electrodes of these rows of n basic capacitances forms a third connection electrode.

Such an integrated circuit is known from Japanese Patent Application 56-201618, which was laid open to public inspection on June 20, 1983 under No. 58-103163. FIG. 3 of this Japanese Patent Application shows a capacitance matrix comprising rows of eighteen basic capacitances. The two outer basic capacitances of each row form dummy capacitances. The second capacitance electrodes of all other basic capacitances of the matrix belong to a common second connection electrode and the second capacitance electrodes of the already mentioned dummy capacitances form the third connection electrode. The different capacitance values are obtained by interconnecting the first connection electrodes of different numbers of rows of basic capacitances so that different multiples of sixteen basic capacitances are formed.

More particularly, but not exclusively in digital-to-analog converters or analog-to-digital converters constructed as integrated circuits, capacitances of different size are often required, whose manufacture requires a high degree of accuracy. Stringent requirements are then often imposed on the accuracy of the ratios of the different capacitance values of the capacitances. Especially if a large number of capacitances and/or large ratios of capacitance values are required, inter alia the limited surface area available for the integrated circuit necessitates to give the smallest capacitance the smallest possible surface area and the lowest possible capacitance value. The possibilities of reducing the size of the capacitances mostly meet their limit where the limitations connected with several of the operations required in the manufacture jeopardize the aforementioned required accuracy. In this connection, inter alia edge effects may be mentioned, which are associated especially with photolithographic and etching treatments. Furthermore, the accuracy may also be limited by the fact that certain operations, viewed over a large surface area, cannot be carried out sufficiently homogeneously. For example, when an insulating layer is applied, instead of a layer having a desired uniform thickness (i.e. the same thickness over its whole area), a layer can be obtained in which, as the case may be locally, a more or less gradual variation in the thickness occurs.

Consequently, for a high degree of accuracy, both a suitable choice of the geometric form of the various capacitances and a suitable arrangement of the capacitances within the overall surface area available for these capacitances are of importance. In the literature available, attention has already been paid to these two aspects. Some examples can be found in Journal of Solid State Circuits, Vol. SC-10, No. 6, December 1975, pages 371-379, I.E.E.E. Transactions on Communications, Vol. COM-27, No. 2, February 1979, pages 296-304 and 1984 I.E.E.E. International Solid State Circuits Conference, February 1984, Digest of Technical Papers, pages 64, 65 and 319. Most of the known capacitance networks are composed of a large number of standard or basic capacitances frequently arranged in a matrix, the different capacitance values being obtained by connecting a suitable number of these basic capacitances in parallel with each other. Thus, especially the influence of deviations from the ideal geometric form of the capacitances on the ratios of the capacitance values is kept comparatively small. Depending upon the practical application and the desired accuracy, a capacitance having a value of 0.25 to 1 pF or higher is used as basic capacitance. In a 10-bit digital-to-analog converter, for which a matrix of 1024 base capacitances is required, the capacitance matrix will then occupy a surface of about 2 mm$^2$ or larger.

In order to enlarge the number of application possibilities of integrated circuits with capacitance networks and/or in order to increase the yield of the manufacture of such integrated circuits, it is of major importance that capacitance networks can be manufactured and utilized in which considerably smaller basic capacitances are used without the required accuracy of the capacitance values and/or the ratios thereof being detrimentally affected. The present invention has inter alia for its object to provide a solution in this direction.

SUMMARY OF THE INVENTION

The present invention is based inter alia on the recognition of the fact that in such capacitance networks often the relative accuracy of the larger capacitances comprising a large number of basic capacitances may be of major importance and that this accuracy may be favorably influenced by the use of comparatively small basic capacitances. It is further based on the recognition of the fact that for the smaller capacitances comprising one or only a few basic capacitances a comparatively large surface area may be used if this may contribute to such a reduction of the basic capacitance that for the capacitance matrix as a whole nevertheless a smaller surface area is required.

According to the invention, an integrated circuit of the kind described in the opening paragraph is characterized in that in a first row of n base capacitances the number of second capacitance electrodes belonging to an associated second connection electrode is smaller than in a second of these rows of n base electrodes.

According to the invention, smaller capacitances having a capacitance value comprising less than n base capacitances are preferably constructed as a part of a fully occupied matrix or sub-matrix of basic capacitances. For each of these smaller capacitances, according to the invention, a complete row of basic capacitances is used. Of this row of basic capacitances, only the required number of second capacitance electrodes belong to a second electrode connection. As a result, the total number of basic capacitances of this matrix or submatrix may be considerably larger than the number belonging to a second electrode connection. As will appear below, this total number of basic capacitances may be, depending upon the practical construction, even ten to twenty times larger than the number of basic capacitances belonging to a second electrode connection. For this part of the capacitance network, a comparatively very large surface area is required. Experiments which have led to the invention have shown, however, that the extent of the occupied surface area can nevertheless be so small that a considerable improvement with respect to the capacitance network known hitherto can be obtained.

In connection with the desired regular pattern of basic capacitances of the capacitance network, preferably each of the second capacitance electrodes of the first row of n base capacitances belonging to an associated second connection electrode is located between two adjacent second capacitance electrodes of the first row, which belong to a further connection electrode.

In an important preferred embodiment of the integrated circuit according to the invention, at least a number of the basic capacitances are arranged in a matrix, which comprises at least a number of the first row conductors and has plural column conductors which interconnect second capacitance electrodes. This matrix advantageously has a central part which comprises all the basic capacitances of the matrix, of which the first capacitance electrodes belong to the first connection electrode and of which the second capacitance electrodes belong to an associated second connection electrode, the central part of the matrix being substantially entirely surrounded by an outer part of the matrix, which outer part comprises at least two substantially complete rows of basic capacitances located at a first side of the central part and at least two substantially complete rows of basic capacitances located at a side of the central part opposite to the first side as well as at least two substantially complete columns of basic capacitances located at a second side of the central part and at least two substantially complete columns of basic capacitances located at a side of the central part opposite to the second side, while at least either the first capacitance electrode or the second capacitance electrode of the basic capacitances belonging to the outer part belongs to a further connection electrode. In this embodiment, the central part of the matrix is surrounded substantially entirely by an edge or outer part comprising dummy capacitances, which edge part has a width of at least two basic capacitances. The basic capacitances, of which one capacitance electrode is connected to a first connection electrode and the other capacitance electrode is connected to an associated second connection electrode, are located in the central part and at a comparatively large distance from the outer edge of the capacitance matrix. As a result, the influence of the marginal effects occurring in some of the processing steps required in the manufacture is reduced.

In a further important preferred embodiment, the matrix preferably has plural rows of base capacitances, of which the first capacitance electrodes belong to a first connection electrode of one of the capacitances of different capacitance values, one or more column conductors having an interruption at an area located between two of these rows, as a result of which these one or more column conductors consist of at least two mutually separated parts. When the column conductors are interrupted in this manner at suitable areas, the second capacitance electrodes of the rows of n basic capacitances can be connected in a comparatively simple manner either to an associated second connection electrode or to a further connection electrode. In this connection, column conductors preferably have only one interruption and the interrupted column conductors consist of two parts, each of these parts extending at least as far as the edge of the matrix.

In order to increase the regularity of the pattern of capacitance electrodes and conductor tracks in the matrix and more particularly in the central part thereof, each row of n basic capacitances comprising one or more basic capacitances belonging to one or more of the capacitances of different capacitance values is located between two row conductors which are connected to a further connection electrode. Thus, the relevant row of n base capacitances can be enclosed in a simple manner between two rows of dummy capacitances.

In a further embodiment of the integrated circuit according to the invention, the capacitance network has plural rows of n basic capacitances, which comprise one or more basic capacitances belonging to one or more of the capacitances of different capacitance values, while there are arranged between every two adjacent rows of these rows at least two row conductors, which are connected to a further connection electrode. By these two row conductors, two rows of dummy capacitances can be connected. In this embodiment the column conductors also have an interruption, these interruptions are preferably situated between the said two row conductors.

BRIEF DESCRIPTION OF THE DRAWINGS

The invention will now be described more fully with reference to several embodiments which are by way of example, and the accompanying drawing, in which.

DESCRIPTION OF THE PREFERRED EMBODIMENTS

Figure 1:
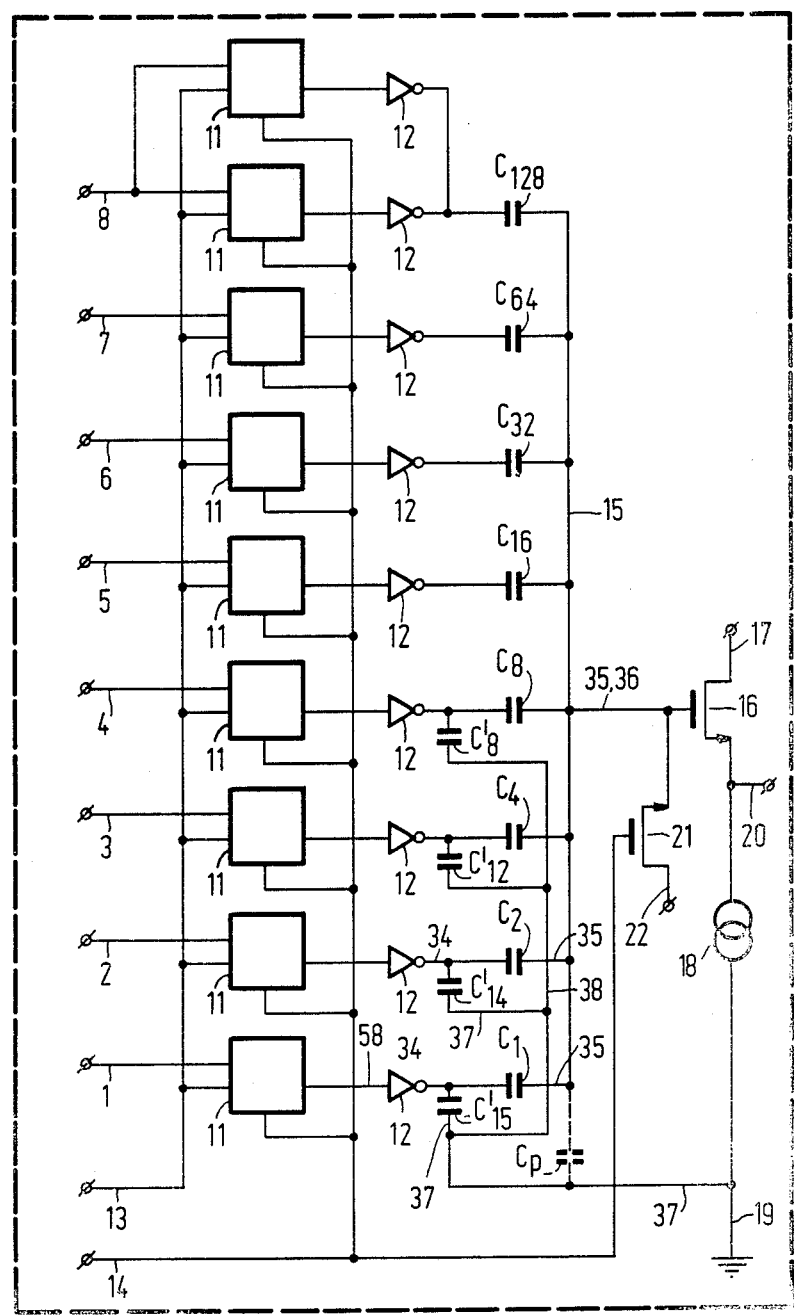
FIG. 1 shows a circuit diagram of an integrated digital-to-analog converter comprising a capacitance network.

The first embodiment is an integrated circuit 10 comprising a digital-to-analog converter. FIG. 1 shows a circuit diagram with inputs 1 to 8, to which digital information encoded in eight bits can be supplied. Via a number of D flipflops 11 and inverter circuits 12, these digital input signals drive a capacitance network which is constituted by the capacitances $C_1$ to $C_{128}$. Via the line 13, the D flipflops 11 can be controlled by a suitable clock signal, while via the line 14 a nonsynchronous reset signal can be supplied.

The capacitance network comprises a series of eight capacitances, of which the capacitance value each time increases by a factor 2 in the order of succession of the series. The capacitance value of the capacitance $C_2$ is therefore twice that of the capacitance $C_1$. The capacitance value of the capacitance $C_{128}$ is twice that of the capacitance $C_{64}$ and is 128 times that of the capacitance $C_1$.

The sides of the capacitances $C_1$ to $C_{128}$ remote from the inverter circuits 12 are connected via the line 15 to each other and to the signal input of a transistor 16 connected as a source follower. In this example, the transistor is an n-channel field effect transistor of the enhancement type, whose drain electrode is connected to a first supply connection 17 and whose source electrode is connected via a current source 18 serving as a load and constituted, for example, by a suitable resistor to a second supply connection 19. This supply connection 19 may be connected, for example, to a point having a suitable reference potential, such as ground. The analog output signal can be derived at 20. Furthermore, a transistor 21 may be provided, with which, if desired, a direct voltage component may be added to the input signal of the transistor 16. For this purpose, the connection 22 may be connected to a suitable reference voltage source. It is also indicated that a parasitic capacitance $C_p$ is present at the input of the transistor 16. The size of this capacitance $C_p$ is determined for a considerable part by the construction of the capacitance network. The capacitance $C_p$ otherwise does not influence the accuracy of the digital-to-analog converter. However, the capacitor $C_p$ gives rise to an attenuation of the analog output signal.

The inverter circuits 12 especially serve as a buffer between the outputs of the flipflops 11 and the capacitances $C_1$ to $C_{128}$, as a result of which the connected outputs of the flipflops 11 can be prevented from being too heavily loaded. In general, the outputs of the inverter circuits 12 and/or the outputs of the flipflops 11 can be adapted to the size of the capacitance $C_1$ or $C_2$ to $C_{128}$ connected to the relevant output so that these capacitances can be charged or discharged sufficiently rapidly. Thus, FIG. 1 shows by way of example that the input 8 is connected via two flipflops 11 and two inverter circuits 12 to the comparatively large capacitance $C_{128}$. If no buffers are required, the inverter circuits 12 of FIG. 1 may be omitted.

During operation, the outputs of the inverter circuits 12 can assume, depending upon the digital information supplied to the inputs 1 to 8, a voltage which is either equal to a first reference or supply voltage or is equal to a second reference or supply voltage. In the present embodiment, the first reference voltage is, for example, about +10 V and the second reference voltage is, for example, about 0 V. As a result of voltage division, each of the capacitances $C_1$ to $C_{128}$ will contribute to the signal voltage at the line 15 which is directly proportional to the capacitance value of the relevant capacitance $C_1$ or $C_2$ to $C_{128}$ and to the output voltage of the relevant inverter circuit 12 and which is inversely proportional to the sum of the capacitance values of the capacitances $C_p$ and $C_1$ to $C_{128}$. The output signal at the output 20 can consequently assume between a given minimum and a given maximum value, divided into 255 voltage steps, a voltage whose value is determined by the digital information supplied to the inputs 1 to 8.

As is known per se, capacitive digital-to-analog converters have many advantages. They can be used inter alia in audio and video applications and in measuring instruments. A disadvantage of these digital-to-analog converters, however, is that the required number of basic or standard capacitances increases exponentially with the number of bits of the digital signal to be converted. As a result, in an integrated construction, the surface area of the common semiconductor body required for the capacitance network often becomes inadmissibly large and/or the ratios between the different capacitance values become too inaccurate so that the analog output signal does not provide a reliable reflection of the digital information supplied to the input.

The integrated circuit 10 has several capacitances $C_1$ to $C_{128}$ which have different capacitance values and it comprises a semiconductor body 30 (FIGS. 2 to 5), at a surface of which rows of first capacitance electrodes 31 are arranged side by side, each of these first capacitance electrodes 31 being separated by a dielectric layer 33 from a second capacitance electrode 32. The first and second capacitance electrodes 31 and 32 constitute the electrodes of basic capacitances 31, 33, 32 arranged in rows, while for forming the capacitances $C_1$ to $C_{128}$ having different capacitance values different numbers of basic capacitances 31, 33, 32 are connected parallel to each other between one or more first and one or more associated second connection electrodes by interconnecting first capacitance electrodes 31 and second capacitance electrodes 32. As will appear below, each row of basic capacitances in the present embodiment comprises twenty basic capacitances 31, 33, 32. The plan view of FIG. 2 does not show all rows and moreover the indicated rows are not shown completely.

Several rows of basic capacitances have the same number of first capacitance electrodes 31, which is equal to n, each of these rows of n base capacitances 31, 33, 32 having a first row conductor 31a, by means of which the n first capacitance electrodes 31 of the relevant row are interconnected, this relevant row of first capacitance electrodes 31 constituting a first connection electrode 34. In the embodiment, the first connection electrode 34 is in the form of a conductor track 31, 31a, which comprises the first capacitance electrodes 31 of the relevant row.

A first group of interconnected second capacitance electrodes 32 of the described rows of n basic capacitances 31, 33, 32 constitutes a second connection electrode 35 associated with the first connection electrode 34. This second connection electrode 35 in the embodiment comprises a number of conductor tracks 32, 32a, which each comprise all or at least a number of second capacitance electrodes 32 of a column of second capacitance electrodes 32. These conductor tracks 32, 32a extending in the column direction are interconnected by means of a further conductor track 36 which extends in the row direction and is also associated with the second connection electrode 35.

A second group of interconnected second capacitance electrodes 32 of these rows of n basic capacitances 31, 33, 32 constitutes a third connection electrode 37. This third connection electrode 37 in the embodiment also comprises a number of conductor tracks 32, 32a which extend in the column direction and each comprise all or at least a number of second capacitance electrodes 32 of a column of second capacitance electrodes 32. These conductor tracks 32, 32a are interconnected by means of a further conductor track 38.

According to the invention, in a first of the rows of n basic capacitances 31, 33, 32, the number of second capacitance electrodes 32 belonging to an associated second connection electrode 35 is smaller than in a second of these rows of n basic capacitances 31, 33, 32. In the present embodiment, all capacitances $C_1$ to $C_{128}$ have a common second connection electrode 35.

Figure 2:
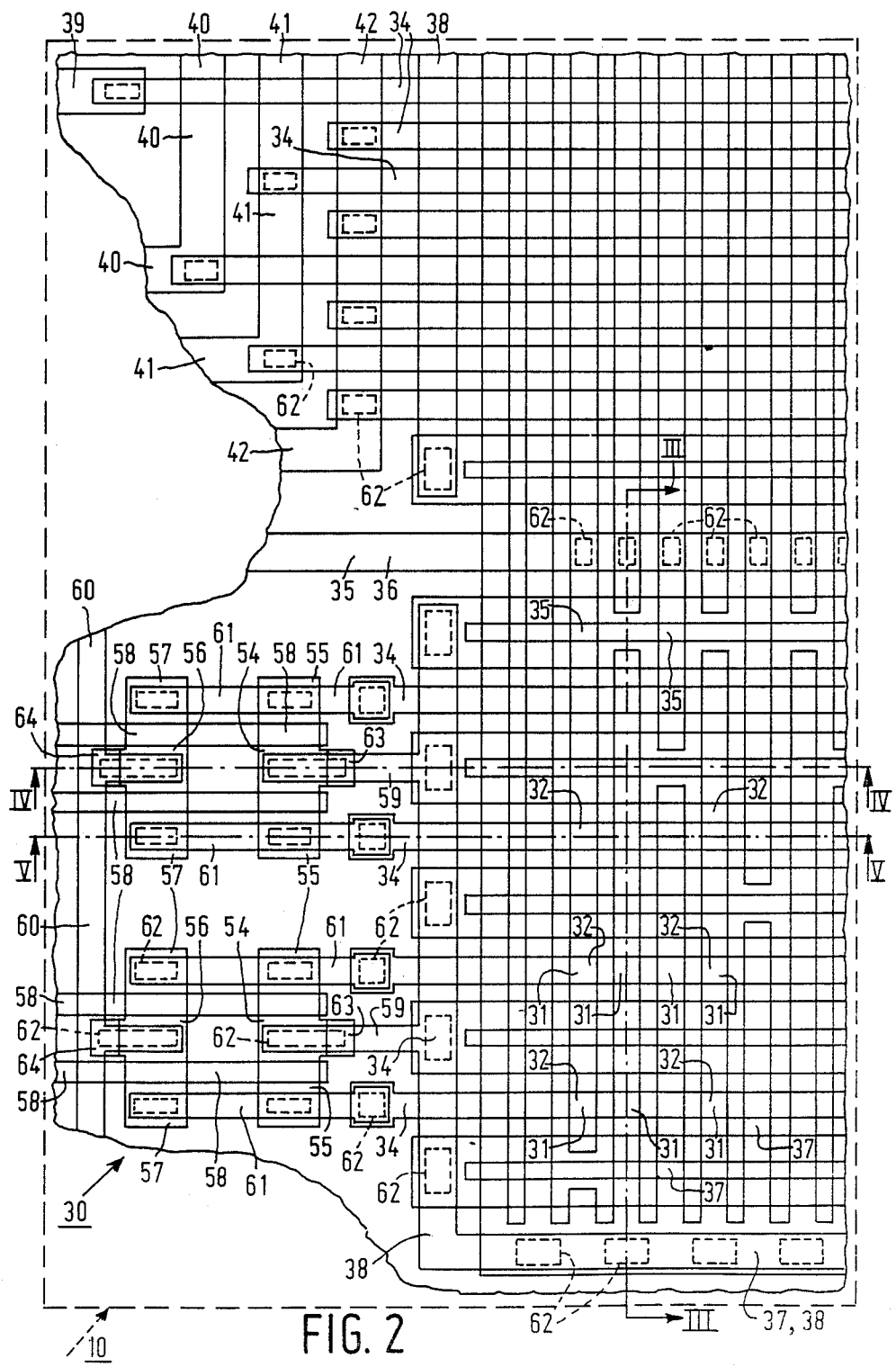
FIG. 2 shows diagrammatically a part of a plan view of the integrated digital-to-analog converter with the circuit diagram of FIG. 1.
Figure 3:
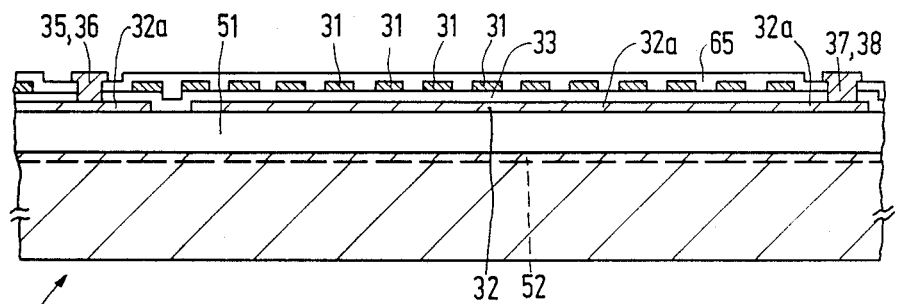
FIGS. 3 to 5 show diagrammatically associated cross-sections taken on the lines III—III, IV—IV and V—V, respectively; of FIG. 2.

It has already been stated that in the present embodiment each of the rows of basic capacitances comprises twenty basic capacitances 31, 33, 32. In the row indicated in FIG. 2 as the third row from below, only one of these basic capacitances 31, 33, 32 is connected to the common connection electrode 35. The nineteen remaining base capacitances 31, 33, 32 of this row are connected to the third connection electrode 37. In the row indicated in FIG. 2 as the sixth row from below, basic capacitances 31, 33, 32 are connected to the second connection electrode 35. Of these two basic capacitances, only one is shown in FIG. 2. Subsequently, in the ninth row four basic capacitances 31, 33, 32 are connected to the second connection electrode 35 and in the twelfth row eight basic capacitances 31, 33, 32 are connected to this electrode. Reckoned from bottom to top, in the seventeenth to the thirty-first row sixteen basic capacitances 31, 33, 32 are connected to the second connection electrode 35. Of these rows, FIG. 2 only shows the seventeenth to the twenty-fourth.

The complete capacitance matrix of the present embodiment consists of a lower submatrix comprising fourteen rows and an upper submatrix comprising nineteen rows, while the conductor track 36 belonging to the second connection electrode 35 extends in the row direction between these two submatrices. Both submatrices each comprise twenty columns.

The lower submatrix comprises the capacitances $C_1$, $C_2$, $C_4$ and $C_8$ of FIG. 1. The upper submatrix comprises the capacitances $C_{16}$, $C_{32}$, $C_{64}$ and $C_{128}$ of FIG. 1. For this purpose, in the upper submatrix the connection electrode 34 of one row is connected to a conductor track 39, the connection electrodes 34 of two rows are connected to a conductor track 40, the connection electrodes of four rows are connected to a conductor track 41 and the connection electrodes of eight rows are connected to a conductor track 42.

Figure 4:
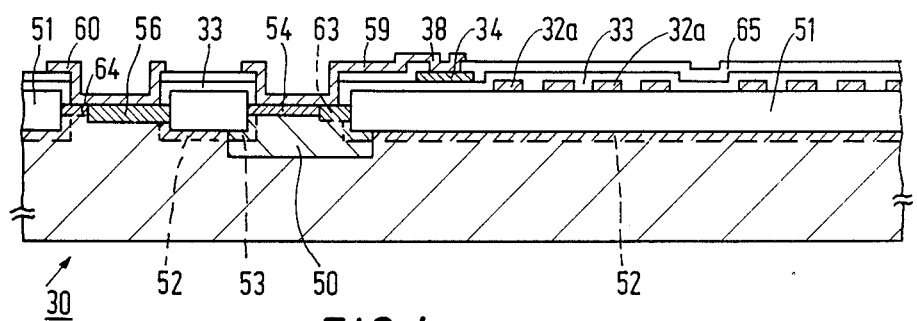
Figure 5:
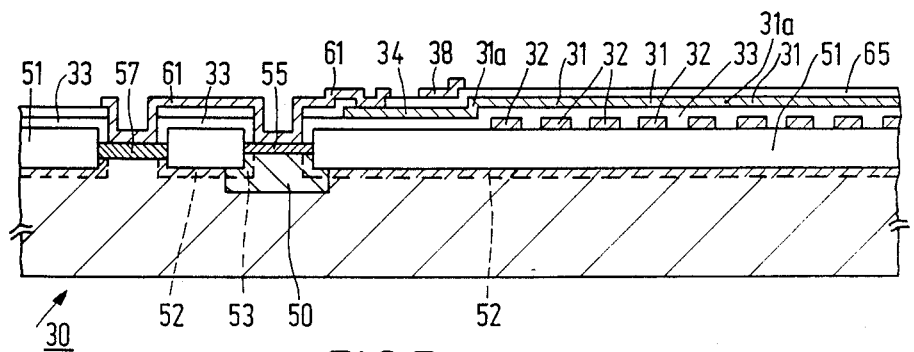

In FIG. 2, furthermore, four of the inverter circuits 12 are indicated. These inverter circuits are constructed in this embodiment in a manner known per se in CMOS technology. For example, the semiconductor body 30 is a silicon body which mainly consists of n-type material. In this semiconductor body, a number of p-type semiconductor regions 50 are formed (FIGS. 4 and 5). Furthermore, the semiconductor body 30 is covered with a thick insulating layer 51 provided with recesses limiting in usual manner the active regions of the integrated circuit. Below this insulating layer 51, more highly doped channel-interrupting zones (channel stoppers) may be present at the semiconductor surface. In this case these zones are the n-type surface zones 52 and the p-type surface zones belonging to the p-type semiconductor regions 50.

In the active regions n- and p-channel transistors are formed. The n-channel transistors have an n-type source zone 54 and an n-type drain zone 55 and the p-channel transistors have a p-type source zone 56 and a p-type drain zone 57. The n- and p-channel transistors have an insulated gate electrode constituted by a conductor track 58. These conductor tracks 58 also form the electrical signal inputs of the inverter circuits.

The n-type source zones 54 and the p-type source zones 56 are connected via a conductor track 59 and 60, respectively, to a supply connection for the most negative supply voltage and to a supply connection for the most positive supply voltage, respectively. The conductor tracks 59 are also connected by means of a more highly doped p-type surface zone 63 to the p-type semiconductor regions 50. The conductor tracks 60 are connected by means of a more highly doped n-type surface zone 64 to the n-type part of the semiconductor body 30.

The electrical signal outputs of the inverter circuits are constituted by conductor tracks 61, which each connect a p-type drain zone 57 and an n-type drain zone 55 to each other and to one or more first connection electrodes 34 of a row of base capacitances.

The different semiconductor zones and conductor tracks, where required, are separated from each other by intermediate insulating layers. These insulating layers are provided with openings 62 in which different conductor tracks are electrically connected to each other or to semiconductor zones. Such openings 62 are indicated by broken lines in FIG. 2.

Figure 6:
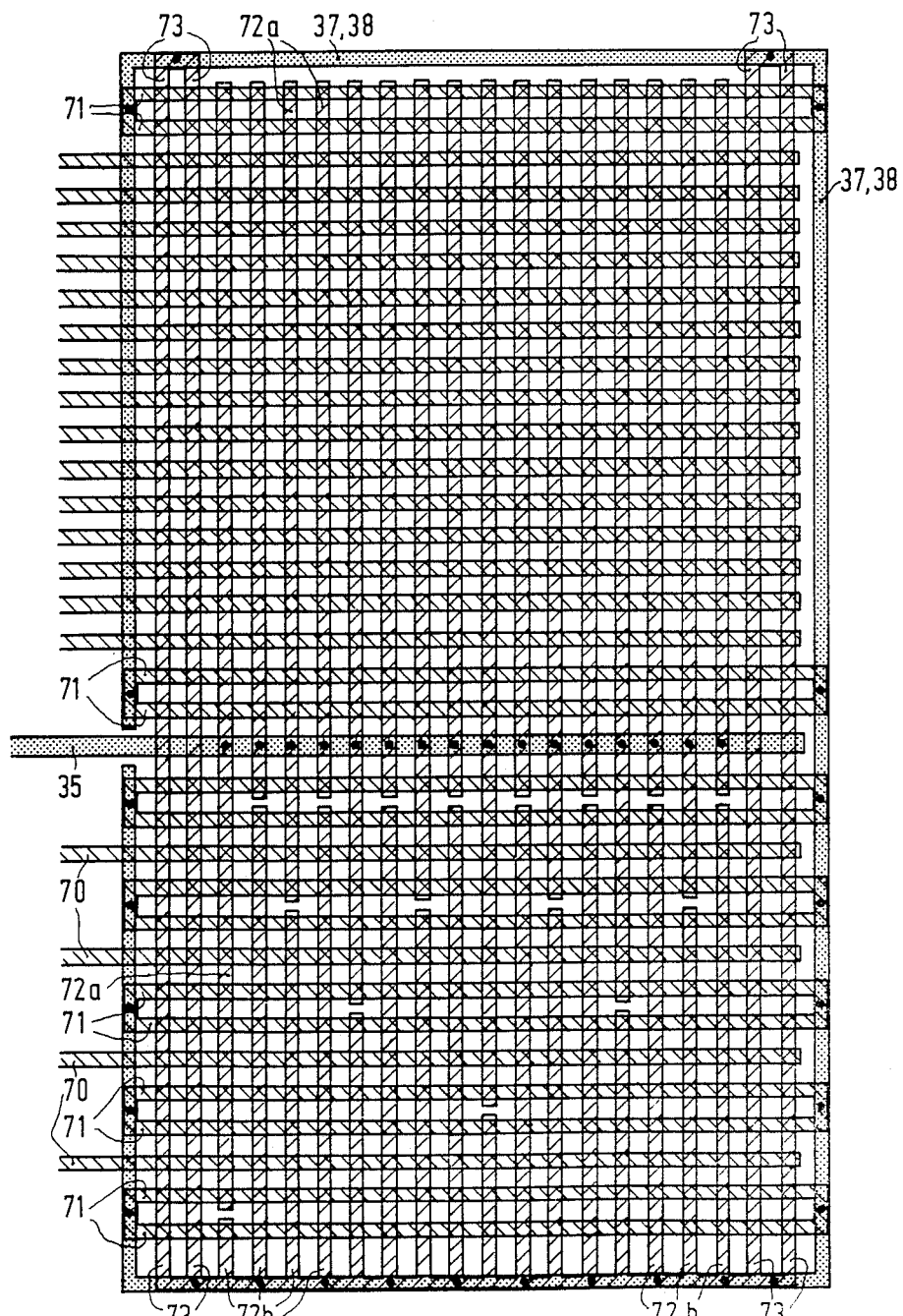
FIG. 6 shows diagrammatically in plan view the capacitance network of the integrated circuit shown in FIGS. 1 to 5.

In FIG. 6, the capacitance network according to the first embodiment is shown diagrammatically in plan view. The capacitance network has a matrix of crossings which are arranged in rows and columns and constitute the basic capacitances. In this FIG. 6, the conductor tracks 31, 31a and 32, 32a of FIG. 2 also extend in the row direction and in the column direction, respectively. The conductor tracks extending in the row direction can be distinguished in conductor tracks 70 belonging to a first connection electrode of one of the capacitances $C_1$ to $C_{128}$ and conductor tracks 71 belonging to a first connection electrode of dummy capacitances. The conductor tracks extending in the column direction can be distinguished in conductor tracks 72 which are interrupted and consist of at least two parts 72a and 72b and conductor tracks 73 which are not interrupted and comprise second capacitance electrodes of dummy capacitances. Adjacent conductor tracks 73 can be interconnected at their ends. The black dots represent electrical connections between conductors arranged in different layers. At the corresponding areas shown in FIG. 2, openings 62 are indicated in FIG. 2.

It is characteristic of the present invention that the matrix comprises a comparatively large number of dummy capacitances. This large number of dummy capacitances is firstly due to the fact that for each of the smaller capacitances $C_1$ to $C_8$ of the capacitance network a whole row of basic capacitances is used. These smaller capacitances $C_1$ to $C_8$ are located in the submatrix indicated below the conductor track 36 belonging to the second connection electrode. The four relevant conductor tracks 70 each comprise a row of twenty crossings, two crossings belonging to dummy capacitances both at the beginning and at the end of the row. These four dummy capacitances per row, which are also present in each row of the submatrix indicated above the conductor track 36, are not shown in the circuit diagram of FIG. 1. Of the remaining sixteen crossings per row, one, two, four and eight, respectively, belong to the capacitances $C_1$ to $C_8$, while the remaining fifteen, fourteen, twelve and eight crossings, respectively, belong to dummy capacitances, which are denoted in FIG. 1 by $C'_{15}$, $C'_{14}$, $C'_{12}$ and $C'_8$, respectively. This division of the crossings into crossings belonging to dummy capacitances and crossings not belonging to dummy capacitances is attained in the present embodiment in that the sixteen conductor tracks 72 in the lower submatrix are interrupted at suitable areas so that these conductor tracks each have two parts 72a and 72b. The parts 72a form with the conductor tracks 70 the crossings belonging to the capacitances $C_1$ to $C_{128}$ and the parts 72b form with the conductor tracks 70 the crossings belonging to the dummy capacitances $C'_{15}$ to $C'_8$.

Preferably, each of the second capacitance electrodes 32 of the first row of n basic capacitances belonging to an associated second connection electrode 35 is located between two adjacent second capacitance electrodes 32 of this first row belonging to a further connection electrode 37. In the present embodiment, this further connection electrode is the third connection electrode 37 to which also belongs the conductor track 38. However, the integrated circuit may also be provided with one or more further connection electrodes separated from each other and/or from the third connection electrode. In the embodiment, in the lower submatrix each conductor track 72a is located at the area of the row of conductor tracks 70 between a conductor track 73 and a conductor track 72b or between two conductor tracks 72b.

Advantageously, in each of the first rows of basic capacitances used for the smaller capacitances $C_1$ to $C_8$ the second capacitance electrodes 32 belonging to the associated second connection electrode 35 of these capacitances $C_1$ to $C_8$ are regularly distributed over the relevant row so that the interruptions in the conductor tracks 72 are also distributed according to a regular pattern over the (sub)matrix. The interruptions are arranged so that of each conductor track 72 the part 72a extends at one side of the submatrix at least as far as the edge of the submatrix and the part 72b extends at a side of the submatrix located opposite to this side at least as far as the edge of the submatrix so that each time both the part 72a and the part 72b are accessible at an edge of the submatrix for electrical connection. This means that in each of the conductor tracks 72 at most one interruption is present within the submatrix.

In an important preferred embodiment of the arrangement according to the invention, each row of basic capacitances comprising one or more basic capacitances belonging to one or more of the capacitances of different capacitance values (each of the first and second rows) is arranged between two row conductors 71, which are connected to a further connection electrode and preferably to the third connection electrode 37. In the present embodiment, each of these adjacent row conductors 71 comprises the first capacitance electrodes 31 of a row of n dummy capacitances.

Advantageously, there are arranged between two adjacent rows of n basic capacitances comprising one or more basic capacitances belonging to one or more of the capacitances of different capacitance values (each of the first and second rows), i.e. between two adjacent row conductors 70 of the lower submatrix, at least two row conductors 71 so that the interruptions of the column conductors 72 can be located between these two row conductors 71 or need at least not be situated between a row conductor 70 and an adjacent row conductor 71. These two adjacent row conductors 71 can be interconnected at their ends, as is indicated in FIGS. 2 and 6.

In a variation of the present embodiment, two adjacent row conductors 71 can be replaced by a single row conductor having a larger width such that the interruptions in the column conductors 72 can be realized within the width dimension of such a widened row conductor. In this case, the facing ends of the parts 72a and 72b consequently both extends as far as below or above this widened row conductor.

The lower submatrix has a central part comprising all basic capacitances of this submatrix, of which the first capacitance electrode 31 belongs to a first connection electrode 34 and of which further the second capacitance electrode 32 belongs to a second connection electrode 35. The central part of the submatrix is substantially entirely surrounded by an outer part of the submatrix, which comprises two substantially complete rows of basic capacitances located at a first side of the central part and two substantially complete rows of basic capacitances located at a side of the central part opposite to the first side. Here the two rows with row conductors 71 located at the upper side and the two rows with row conductors 71 located at the lower side of the submatrix are concerned. Moreover, the outer part comprises two substantially complete columns of basic capacitances located at a second side of the central part and at least two substantially complete columns of basic capacitances located at a side of the central part opposite to the second side. The two columns with column conductors 73 located at the lefthand side of the submatrix and the two columns with column conductors 73 located at the opposite righthand side of the submatrix are concerned here. Of the basic capacitances belonging to the outer part of the submatrix, at least either the first capacitance electrode 31 or the second capacitance electrode 32 is connected to a further connection electrode 37. In this embodiment, the outer part of the submatrix comprises an edge part having a width of two capacitances and constituted by dummy capacitances.

Also the upper submatrix has both at its upper side and at its lower side two row conductors 71. Both at the lefthand and at the righthand side of this submatrix there are arranged two column conductors 73. Thus, the upper submatrix also has an edge part having a width of two capacitances and constituted by dummy capacitances.

Consequently, the matrix as a whole also has an outer part which surrounds substantially completely the central part of the matrix as an edge part having a width of two basic capacitances.

Preferably, the (sub)matrix (matrices) has (have) at the lower and upper side three row conductors 71 so that at least at this side the edge part is in the form of an edge part having a width of three dummy capacitances. At these sides, an unfavorable influence of the boundary of the matrix will become manifest, especially in one capacitance and perhaps also in a second capacitance of the network farther remote from the edge, while the boundary extending parallel to the column direction will have a comparable influence on substantially all the capacitances of the network. If permitted by the area available, the whole edge may also be in the form of a surrounding edge part having a width of three dummy capacitances. The basic capacitances, of which the first capacitance electrode belongs to a first connection electrode and the second capacitance electrode belongs to a second connection electrode, are then located even farther from the outer edge of the relevant matrix than in the case of an edge having a width of two dummy capacitances. In this manner, the influence of edge effects, which may occur in some of the operations used in the manufacture and which may lead to deviations in the capacitance values of basic capacitances located near the edge of the matrix, is further reduced.

At the upper side of the upper submatrix, the parts 72a of the column conductors 72 extend at least as far as substantially the upper edge of the upper row conductor 71. The upper submatrix may also be closed at the upper side in a similar manner as the lower submatrix at its lower side. In this case, each of the column conductors 72 at this side has a third part, these third parts at this upper side being interconnected in the same manner as the parts 72b at the lower side of the lower submatrix and being united via a connection part which extends in the row direction and is practically in the same position as the part of the third connection electrode 37 shown at the upper side of FIG. 6. All column conductors 72 in this variation have a second interruption, these second interruptions all being situated essentially between the two row conductors 71 shown at the upper side of FIG. 6.

The object of all the measures described so far is to provide a capacitance matrix constructed as regularly as possible. Each of these measures contributes to this object. More particularly the basic capacitances belonging to the smaller capacitances $C_1$ to $C_8$ are surrounded as far as possible completely by substantially identical basic capacitances constituting dummy capacitances. From an electrical point of view, the dummy capacitances of the matrix can be subdivided into three kinds. Dummy of the first kind have a first capacitance electrode 31, which belongs to a first connection electrode 34 of one of the capacitances $C_1$ to $C_{128}$. The second capacitance electrodes 32 of these dummy capacitances of the first kind belong to the third connection electrode 37 or at least to a further connection electrode. The dummy capacitances of this first kind are constituted in the embodiment by crossings of the conductor tracks 70 with the conductor tracks 73 and with the conductor tracks 72b. Inter alia the basic capacitances forming part of the capacitances $C'_8$ to $C'_{15}$ of FIG. 1 belong to the dummy capacitances of the first kind. The dummy capacitances of the second kind have a second capacitance electrode 32 which belongs to a second connection electrode 35. The first capacitance electrodes 31 of these dummy capacitances of the second kind are connected to the third connection electrode 37 or at least to a further connection electrode. The dummy capacitances of this kind are constituted in the embodiment by the crossings of the conductor tracks 71 with the conductor tracks 72a. In the present embodiment, they provide for a contribution to the capacitance $C_p$ of FIG. 1. The dummy capacitances of the third kind are constituted by the basic capacitances, of which both the first capacitance electrode 31 and the second capacitance electrode 32 belong to the third connection electrode 37 or at least to a further connection electrode. In the embodiment, these capacitances are the crossings of the conductor tracks 71 with the conductor tracks 73 and with the conductor tracks 72b.

The capacitance matrix of FIG. 6 comprises 660 basic capacitances in all. The lower submatrix has 280 basic capacitances. Of these 280 basic capacitances 265 are dummy capacitances. The upper submatrix has 380 base capacitances. The number of dummy capacitances of the upper submatrix is 140. In spite of this extremely large number of dummy capacitances, the overall capacitance value of the capacitance matrix of the first embodiment in a practical example was less than 5.2 pF. The sum of the capacitance values of the capacitances $C_1$ to $C_{128}$ is only about 2 pF. The capacitance matrix occupied a surface area of about 0.07 mm$^2$. By addition of three further submatrices of 20 rows and 20 columns, a capacitance network for a 10-bit analog-to-digital converter can be obtained. The overall capacitance value of this extended capacitance matrix is then about 15 pF. For this extended capacitance matrix, only a surface area of about 0.2 mm$^2$ is required. It will be clear that such an extended capacitance matrix may alternatively be composed, for example, of a submatrix for the capacitances $C_1$ to $C_{16}$ with 17 rows of 36 crossings and of a submatrix for the capacitances $C_{32}$ to $C_{512}$ with 35 rows of 36 crossings. Also with this construction, the surface area required for the capacitance matrix is about 0.2 mm$^2$ and the overall capacitance value is about 15 pF. In spite of the fact that such an extended capacitance matrix comprises about 850 dummy capacitances, the required surface area is about a factor 10 smaller than that of the capacitance matrix known from the aforementioned article in Digest of Technical Papers, ISSCC'84, which does not comprise any dummy capacitances. This is due to the fact that it has been found that by the use of the present invention the basic capacitances can be given a much smaller size and a considerably smaller capacitance value of, for example, about $8.10^{-3}$ pF, while nevertheless the required high degree of accuracy of the realized ratios of capacitance values is obtained.

The integrated circuit shown in FIGS. 1 to 6 can be manufactured wholly by methods known in the semiconductor technology, such as doping and deposition treatments, oxidation, photolithographic operations and etching techniques.

For example, the starting material may be an n-type silicon body 30, which may be composed of an n-type substrate on which an n-type epitaxial layer having a resistivity of about 4 $\Omega$.cm and a <100> orientation is formed. A silicon oxide layer of about 50 nm and a silicon nitride layer having a thickness of about 150 nm are applied to the surface of the body 30.

After the silicon nitride layer has been patterned, for example arsenic may be implanted for the n-type channel stopper 52. A photolacquer pattern is then provided, which serves as a mask when providing the doping for the p-type semiconductor regions 50 and the p-type channel stopper 53. For example, boron is implanted at about 150 keV at a dose of about $4 \cdot 10^{12}$ ions/cm$^2$ and at 30 to 40 keV at a dose of about $1.5 \cdot 10^{13}$ ions/cm$^2$. The first implantation is not masked by the part of the silicon nitride pattern not covered by the photolayer, whereas to the contrary the second implantation is masked by this part.

After the photolacquer pattern has been removed, a treatment at high temperature, for example at about 1200° C., is carried out in an oxidizing atmosphere, during which treatment the field oxide 51 is formed.

Subsequently, in a usual manner a polycrystalline or an amorphous silicon layer having a thickness of about 0.4 $\mu$m can be deposited, which is doped, for example, with phosphorus during and/or after the deposition. The conductor tracks 32, 32a are obtained from this deposited silicon layer. The tracks have a width of, for example, about 5 $\mu$m, while their relative distance can also be about 5 $\mu$m.

Subsequently, the silicon nitride pattern and the underlying oxide are removed and a fresh oxide layer is formed by thermal generation. The conductor tracks 32, 32a are then coated with an oxide layer having a thickness of, for example, about 130 nm. In the regions intended for the transistors of the circuit, this fresh oxide layer serves as a gate dielectric.

Thereafter, again a phosphorus-doped polycrystalline or amorphous silicon layer having a thickness of about 0.4 $\mu$m is formed. The conductor tracks 31, 31a and the gate electrode 59 are obtained from this silicon layer. The width of the conductor tracks 31, 31a is, for example, about 5 $\mu$m. The relative distance of the conductor tracks 31, 31a can be about 5 $\mu$m.

By means of a photolacquer mask, the doping for the n-type source and drain zones 54 and 55 and the n-type zone 64 can be provided. For example, arsenic is implanted at about 150 keV at a dose of about $2 \cdot 10^{15}$ ions/cm$^2$. This doping can be diffused at a temperature of about 1100° C. further into the semiconductor body 30 after the photolacquer mask has been removed.

By means of a fresh photolacquer mask, boron can now be implanted for the p-type source and drain zones 56 and 57 and the p-type zone 63. A suitable dose is about $3.6 \cdot 10^{14}$ ions/cm$^2$ and a suitable implantation energy is, for example, about 40 keV. By means of the same photolacquer mask, an implantation for the adjustment of the threshold voltage of the p-channel transistors can also be effected. For this purpose, for example, boron can be implanted at a dose of about $3 \cdot 10^{11}$ ions/cm$^2$ at about $3 \cdot 10^{11}$ ions/cm$^2$ at about 180 keV.

After a short oxidation treatment, an insulating layer 65 of, for example, silicon oxide having a thickness of, for example, about 0.8 $\mu$m can be deposited. In order to improve this passivation of the integrated circuit, the top layer of this silicon oxide layer can be doped, for example, with phosphorus. Before and/or after this doping, a thermal treatment at about 1000° C. can be carried out, during which treatment inter alia the implanted boron diffuses further into the semiconductor body.

Subsequently, the required windows 62 are opened and a conductive layer of aluminum or another suitable is deposited. In a usual manner, the conductor tracks 36, 38, 39–42 and 59–61 can be obtained from this conductive layer. If desired, a further insulating layer (not shown) consisting, for example, of silicon oxide and/or silicon nitride may be provided over this pattern of conductor tracks.

By the aforementioned processing steps, in a usual manner a large number of integrated circuits can be formed in a common silicon wafer. After this common silicon wafer has been subdivided in a usual manner into separate silicon bodies 30, the integrated circuits obtained can be mounted in an envelope in a usual manner.

In the integrated circuit described, the base capacitances have a surface area of about 25 $\mu$m$^2$ and a capacitance value of about 7.5 to $8.10^{-3}$ pF. The 8-bit digital-to-analog converter described had a non-linearity of about 0.25 lsb (least significant bit). It appears therefrom that the realized ratios of capacitance values have a high degree of accuracy in spite of the use of basic capacitances having a very small capacitance value. Thus, it is demonstrated that with the arrangement described of the basic capacitances in a capacitance matrix having a comparatively large number of dummy capacitances, capacitance networks having a comparatively small surface area and, comparatively, a surprisingly high degree of accuracy can be obtained.

Figure 7:
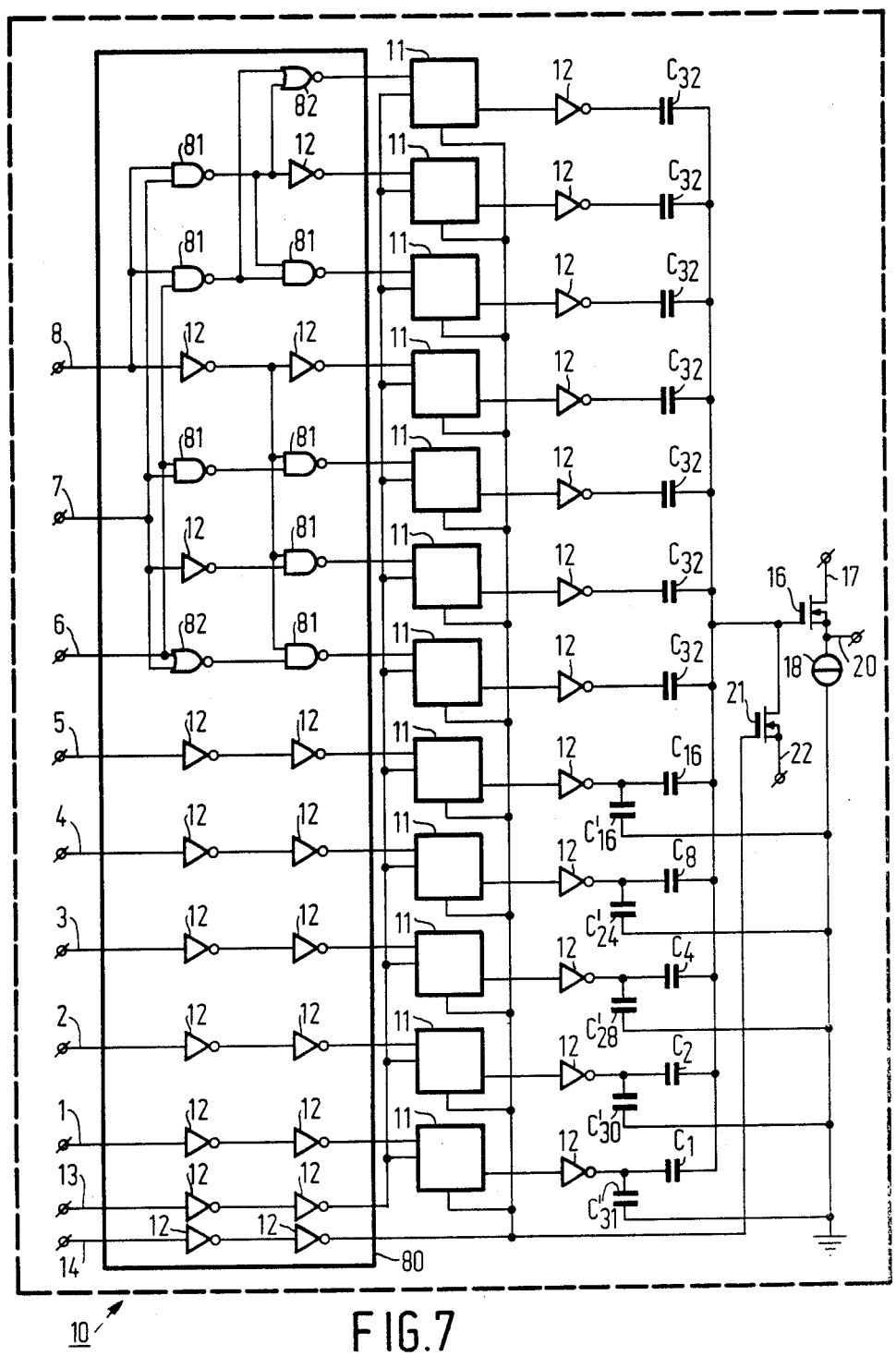
FIG. 7 shows a circuit diagram of a variation of the integrated digital-to-analog converter shown in FIG. 1.

With respect to the circuitry of the digital-to-analog converter of the first embodiment it is further to be noted that positive or negative peaks may occur in the output signal if the capacitances are not charged and discharged at substantially the same speed. Preferably, in this connection the outputs of the flip-flops 11 or inverter circuits 12 connected to the capacitances are proportioned so that the rising and falling edge of signals occurring at these different outputs all have substantially the same delay with respect to the clock signal, while further the rise time is substantially equal to the fall time. If required, undesirable signal peaks may be removed from the output signal of the digital-to-analog converter by filtering this signal. A further possibility of limiting signal peaks is shown in FIG. 7. The large capacitances $C_{64}$ and $C_{128}$ are subdivided into separately driven capacitances, which each have a capacitance value of 32 basic capacitances. On behalf of this separate drive, a number of flipflops 11 and inverter circuits 12 are added to the circuit arrangement. Moreover, the inputs 1 to 8 and the connections 13 and 14 are connected through a logic network 80, which can be composed in a conventional manner of NAND gates 81, NOR gates 82 and inverter circuits 12, to the flipflops 11. The logic network 80 is constructed so that with a small variation of the digital information supplied, for example the step from 127 to 128, the charge variation occurring in the capacitance matrix is limited. This charge variation at most corresponds to charging (or discharging) of one capacitance $C_{32}$ and discharging (or discharging) of the capacitances $C_1$ to $C_{16}$. For the step from 127 to 128, to the contrary, in the circuit arrangement shown in FIG. 1, the capacitance $C_{128}$ is charged and the capacitances $C_1$ to $C_{64}$ are discharged. By the use of the circuit arrangement of FIG. 7, the maximum value of the peaks that may occur in the output signal of the digital-to-analog converter is consequently limited considerably.

Another advantage of the circuit arrangement shown in FIG. 7 is that all outputs of inverter circuits 12 or flipflops 11 connected to the capacitance matrix are loaded by the same number of basic capacitances. The inverter circuits 12 or flipflops 11 need consequently not be adapted to relatively different capacitive loads. They may be equal to each other, as a result of which inter alia the equal rise and fall times desirable in connection with the peaks that may occur in the output signal of the digital-to-analog converter can be realized more readily.

In the integrated circuit according to the invention, the capacitance matrix need not necessarily form part of a digital-to-analog converter. Other circuit arrangements comprising plural capacitances of different capacitance values, such as digital-to-analog converters and switched capacitor circuits, may also be integrated with the use of the present invention. With the capacitance matrix, capacitance ratios quite different from the powers of 2 described can be realized. Furthermore, instead of a number of mutually separated first or input connection electrodes 34 and a common second or output connection electrode 35, a common input connection electrode and mutually separated output connection electrodes may be present. The capacitance matrix may also have plural mutually-separated input connection electrodes and plural mutually-separated output connection electrodes. In practical cases, it depends upon the circuit that is integrated, which embodiment is chosen. It may then be desirable to adapt the geometric topology of the capacitance matrix to the desired electrical arrangement of capacitances and/or to the required capacitance ratios.

Figures 8, 9:
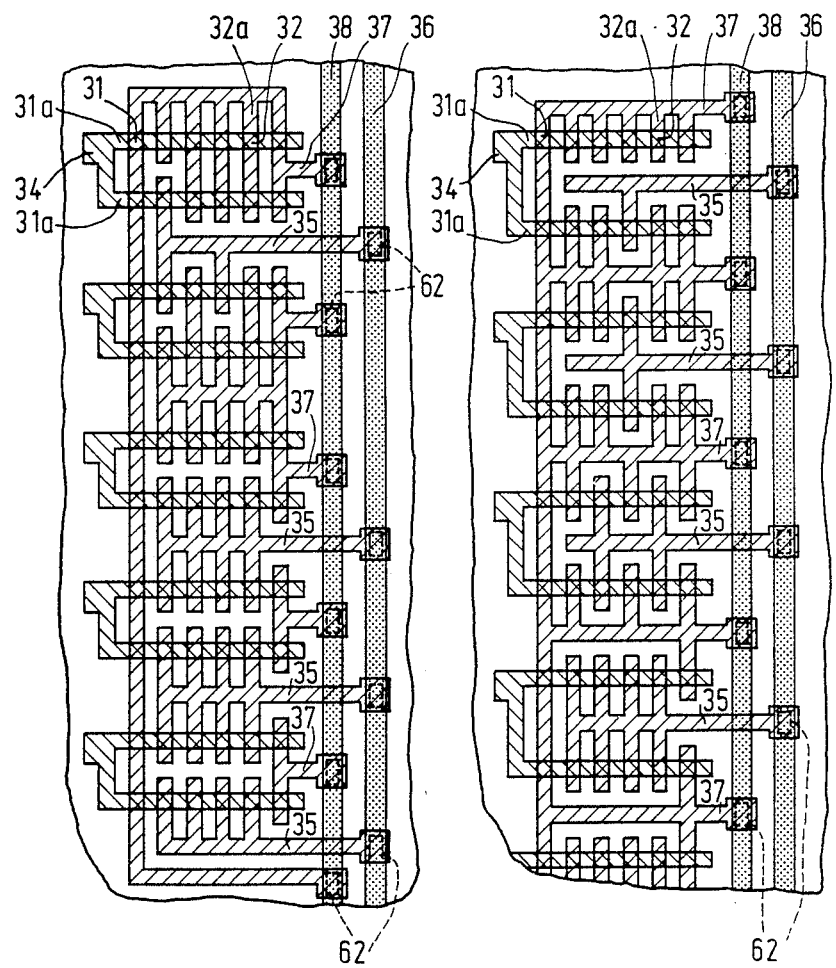
FIG. 8 shows diagrammatically in plan view a part of another embodiment of the integrated circuit according to the invention, i.e. the part representing the capacitance network.
FIG. 9 shows diagrammatically in plan view a part of a capacitance network of a further embodiment of an integrated circuit according to the invention.

FIGS. 8 and 9 show examples of another geometric topology. In these examples, each first connection electrode 34 has two interconnected conductor tracks 31, 31a, which comprise first capacitance electrodes 31. Furthermore, conductor tracks 32, 32a extending in the column direction (in the drawing in vertical direction) are present, which each comprise one or more second capacitance electrodes 32. For the sake of simplicity, rows of not more than six basic capacitances 31, 33, 32 are shown in the capacitance matrices of FIGS. 8 and 9. A dummy capacitance is present at both ends of each row. The second capacitance electrodes 32 of these dummy capacitances are connected to a third connection electrode 37. A number of these connection electrodes 37 are connected to each other through a further conductor track 38. The remaining second capacitance electrodes 32 are connected for one part to a third connection electrode 37 and for another part to a second connection electrode 35. The connection electrodes 35 are connected to each other through a further conductor track 36. In FIGS. 8 and 9, there is indicated in the same manner as in FIG. 6, in which layer of conductor tracks the different conductor tracks are provided. The conductor tracks 35, 37 and 32, 32a are located in a first lower layer; the conductor tracks 34 and 31, 31a are located in a second layer insulated from the first layer, while the conductor tracks 36 and 38 belong to a third layer insulated from the first layer and the second layer. Furthermore, a few openings 62 in an intermediate insulating layer are indicated.

FIG. 8 shows five capacitances with capacitances ratios 1:2:4:8:8. If in FIG. 8 the conductor track 36 is omitted, the upper part of the capacitance matrix shown comprises two capacitances with a capacitance ratio 1:2, which have mutually separated first connection electrodes 34 and a common second connection electrode 35. These two capacitances may constitute a series arrangement. Furthermore, a comparable series arrangement comprising five capacitances having a capacitance value four times that of the smallest capacitance is present in the remaining part.

FIG. 9 shows four capacitances with capacitance ratios 1:2:4:8. If in FIG. 9 the conductor track 36 is omitted, each of these four capacitances has a separated first connection electrode 34 and a separated second connection electrode 35.

FIGS. 8 and 9 consequently show inter alia that quite different configurations of capacitances can be realized with comparatively small adaptations in the geometric topology of the capacitance matrix with respect to the circuit arrangement.

It will be appreciated that the present invention is not limited to the embodiments described, but that many variations are possible within the scope of the invention for those skilled in the art. The integrated circuit may also be constructed in NMOS or PMOS technology instead of in CMOS technology. Furthermore, the capacitance matrix described may form part of a bipolar integrated circuit, in which the conductor tracks and connection electrodes are provided, for example, in two layers of a suitable conductive material, such as aluminum. The conductor tracks 31, 31a and 34 of FIG. 2 may then be provided in the same layer as the conductor tracks 36, 59, 60 and 61, while the conductor tracks 38 to 42 may be provided in the same layer as the conductor tracks 32, 32a. Furthermore, the row and column conductors of silicon described may be replaced wholly or in part by or converted into a suitable silicide. Preferably, the row conductors, the column conductors and the capacitance electrodes are made of the same materials or at least of similar materials. However, it is possible to provide the row conductors and the column conductors, respectively, with the associated capacitance electrodes in the semiconductor body, for example in the form of doped zones and/or silicated surface regions and to manufacture only the column conductors and the row conductors, respectively, with the associated capacitance electrodes from a conductive layer applied to the semiconductor body. The doped zones may be of a conductivity type which is opposite to that of the semiconductor body 30. They may also be provided in one or more regions comparable with the doped regions 50. In the last-mentioned case, for example the pn junction(s) between the comparable region(s) and the adjoining part of the semiconductor body may be shortcircuited, if required, in order to suppress undesired transistor effects. If desired, however, other usual solutions for suppressing parasitic transistor effects and/or other parasitic effects may also be used. In such an embodiment, inter alia the doping concentration of the doped zones may impose a limitation on the maximum permissible operating voltage of the capacitances and/or on the polarity of this operating voltage.

In the examples described, the conductor tracks comprising the capacitance electrodes have the same width throughout their length. In connection with the desired compactness of the capacitance matrix, such an embodiment is to be preferred. However, if required, the conductor tracks may have widened parts at the area of the capacitance electrodes 31, 32, for example, in order to increase the capacitance value of the basic capacitances.

The semiconductor body may also be formed from a monocrystalline semiconductor layer which extends on an insulating substrate. In this case, the capacitance matrix may be realized on and/or in the semiconductor layer or may be provided directly on the insulating substrate. Furthermore, circuit elements of the integrated circuit, such as transistors and resistors, may also be realized in known manner wholly or in part in a polycrystalline semiconductor layer that may be recrystallized.

In the examples described, other materials may be used. Instead of silicon, for example, other semiconductors, such as germanium or $A^{III}$-$B^{V}$ compounds, may be used. Oxide layers obtained by thermal generation may be replaced by deposited oxide layers or, for example, by silicon nitride layers. Instead of oxide layers and/or nitride layers, other suitable insulating layers, such as aluminum oxide layers, may be used. Furthermore, insulating layers may consist of several sublayers of different insulating materials or of a mixture of such materials. For example, oxynitride layers may be used. The dielectric of the basic capacitances may consist wholly or in part of silicon nitride, while the comparatively high dielectric constant of this material may be advantageous.

In general the use of the invention leads to integrated circuits comprising capacitances of different capacitance values, in which the ratios of the capacitance values are comparatively accurate and the absolute capacitance values are comparatively small. Consequently, not only is the area required for the integrated capacitances comparatively small, but generally also the dissipation occurring in the capacitance matrix is comparatively low. This low dissipation is especially advantageous because the maximum permissible dissipation of the integrated circuit as a whole causes the designer of integrated circuits to meet more or less serious limitations inter alia because of the maximum permissible temperature of the semiconductor body. Additionally also the peak currents occurring in the capacitance matrix are comparatively small, as a result of which disturbances are less liable to occur in other parts of the integrated circuits. Moreover, the conductor tracks in the capacitance matrix are comparatively short, as a result of which the series resistance per unit lengthin these conductor tracks is allowed to be comparatively large without the operating speed being too strongly limited thereby.

What is claimed is:

1. An integrated circuit comprising plural capacitances, each with a first and second connection electrode, which have different capacitance values, said circuit comprising a semiconductor body, rows of first capacitance electrodes arranged beside each other at a surface of said body, a dielectric layer, and second capacitance electrodes, each of said first capacitance electrodes being separated by said dielectric layer from one of said second capacitance electrodes, the first and second connection electrodes comprising the electrodes of a plurality of basic capacitances arranged in rows, different numbers of basic capacitances between one or more first and one or more associated second connection electrodes being connected in parallel with each other to form the capacitances having different capacitance values by interconnection of first and second capacitance electrodes, plural rows of basic capacitances having the same number n of first capacitance electrodes and each of these rows of n basic capacitances having a first row conductor by means of which all n first capacitance electrodes of the row are interconnected, one or more rows of interconnected first capacitance electrodes forming a first connection electrode, a first group of interconnected second capacitance electrodes of said rows of n basic capacitances forming a second connection electrode associated with said first electrode, a plurality of dummy basic capacitances, and a second group of interconnected second capacitance electrodes of said rows of n basic capacitances which form a third connection electrode, the third connection electrode comprising second capacitance electrodes of said dummy basic capacitances, and, in a first row of n basic capacitances, the number of second capacitance electrodes in said first row belonging to an associated second connection electrode being at least one and smaller than in a second of said rows of n basic electrodes.

2. An integrated circuit as claimed in claim 1 characterized in that each of the second capacitance electrodes of the first row of n basic capacitances belonging to an associated second connection electrode is located between two adjacent second capacitance electrodes of the first row belonging to a further connection electrode.

3. An integrated circuit as claimed in claim 1 or 2, characterized in that at least a number of the basic capacitances are arranged in a matrix, which comprises at least a number of the first row conductors and has plural column conductors which interconnect second capacitance electrodes.

4. An integrated circuit as claimed in claim 3, characterized in that the matrix has a central part which comprises all the capacitances of the matrix, of which the first capacitance electrodes belong to the first connection electrode and of which the second capacitance electrodes belong to an associated second connection electrode, the central part of the matrix being substantially entirely surrounded by an outer part of the matrix, which outer part comprises at least two substantially complete rows of basic capacitances located at a first side of the central part and at least two substantially complete rows of basic capacitances located at a side of the central part opposite to the first side as well as at least two substantially complete columns of basic capacitances located at a second side of the central part and at least two substantially complete columns of basic capacitances located at a side of the central part opposite to the second side, while at least one of the first capacitance electrode and the second capacitance electrode of the basic capacitances belonging to the outer part belongs to a further connection electrode.

5. An integrated circuit as claimed in claim 3, characterized in that plural rows of n basic capacitances are provided in the matrix, of which the first capacitance electrodes belong to a first connection electrode of one of said capacitances of different capacitance values, while one or more of the column conductors has an interruption at an area located between two of these rows, as a result of which these one or more column conductors comprise at least two mutually-separated parts.

6. An integrated circuit as claimed in claim 5, characterized in that said one or more column conductors each have within the matrix a single interruption and each consist of two parts, each of these parts extending at least as far as an edge of the matrix.

7. An integrated circuit as claimed in claim 1 or 2, characterized in that each row of n basic capacitances comprising one or more basic capacitances belonging to one or more of said capacitances of different capacitance values is located between two row conductors which are connected to a further connection electrode.

8. An integrated circuit as claimed in claim 1 or 2, characterized in that plural rows of n basic capacitances are provided, which rows each comprise one or more basic capacitances belonging to one or more of said capacitances of different capacitance values, at least two row conductors connected to a further connection electrode extending between every two adjacent rows of these plural rows.

9. An integrated circuit as claimed in claim 7, characterized in that each of said two row conductors interconnects the first capacitance electrodes of a row of n basic capacitances.

* * * * *